US009906202B1

(12) United States Patent
Lovejoy, Jr. et al.

(10) Patent No.: US 9,906,202 B1
(45) Date of Patent: Feb. 27, 2018

(54) MULTI-LAYER WIDEBAND ANTENNA WITH INTEGRATED IMPEDANCE MATCHING

(71) Applicant: LOCKHEED MARTIN CORPORATION, Bethesda, MD (US)

(72) Inventors: James L. Lovejoy, Jr., Colorado Springs, CO (US); Thomas Patrick Cencich, Littleton, CO (US); W. Neill Kefauver, Littleton, CO (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 292 days.

(21) Appl. No.: 14/260,217

(22) Filed: Apr. 23, 2014

(51) Int. Cl.
*H01Q 1/50* (2006.01)
*H03H 7/38* (2006.01)
*H01Q 21/00* (2006.01)

(52) U.S. Cl.
CPC ............... *H03H 7/38* (2013.01); *H01Q 1/50* (2013.01); *H01Q 21/0087* (2013.01)

(58) Field of Classification Search
CPC ............................ H01Q 1/50; H01Q 21/0087
USPC .................................................. 343/770, 895
See application file for complete search history.

(56) References Cited

U.S. PATENT DOCUMENTS

| | | | | |
|---|---|---|---|---|
| 4,040,060 A * | 8/1977 | Kaloi | ................... | H01Q 9/0421 343/700 MS |
| 4,658,262 A * | 4/1987 | DuHamel | .............. | H01Q 11/10 343/792.5 |
| 6,072,375 A * | 6/2000 | Adkins | ................... | H01P 3/088 333/1 |
| 6,549,175 B1 | 4/2003 | Cencich et al. | | |
| 6,664,935 B1 * | 12/2003 | Thompson | ................ | H01P 5/02 333/124 |
| 2014/0320231 A1 * | 10/2014 | Seler | ...................... | H01L 24/25 333/26 |

OTHER PUBLICATIONS

Filipovic, et al., "Frequency Independent Antennas," Antenna Engineering Handbook, Fourth Edition, 2007, Chapter 13, pp. 19-20, McGraw-Hill, editor John Volakis.
Huffman, et al., "Modal Impedances of Planar, Non-Complementary, N-fold Symmetric Antenna Structures," IEEE Antennas and Propagation Magazine, vol. 47, No. 1, Feb. 2005, pp. 100-116.
Radway, "Mode Theory of Multi-Armed Spiral Antennas and Its Application to Electronic Warfare Antennas," Ph.D. dissertation, Dept. Elect., Comp., Energy Eng., Univ. of Colorado, Boulder, CO, 2011.

* cited by examiner

*Primary Examiner* — Graham Smith
*Assistant Examiner* — Noel Maldonado
(74) *Attorney, Agent, or Firm* — McDermott Will & Emery LLP

(57) ABSTRACT

A radio-frequency (RF) antenna with wideband impedance matching includes a first conductive layer, a second conductive layer, and patterned connections. The first conductive layer is formed on a first surface of a dielectric material. The second conductive layer is formed on a second surface of the dielectric material. The patterned connections between the first conductive layer and the second conductive layer are formed through multiple vias to enable the wideband impedance matching. The first conductive layer and the second conductive layer are formed based on an antenna-layout pattern. The multiple vias are formed based on a via pattern that corresponds to the antenna-layout pattern.

20 Claims, 8 Drawing Sheets

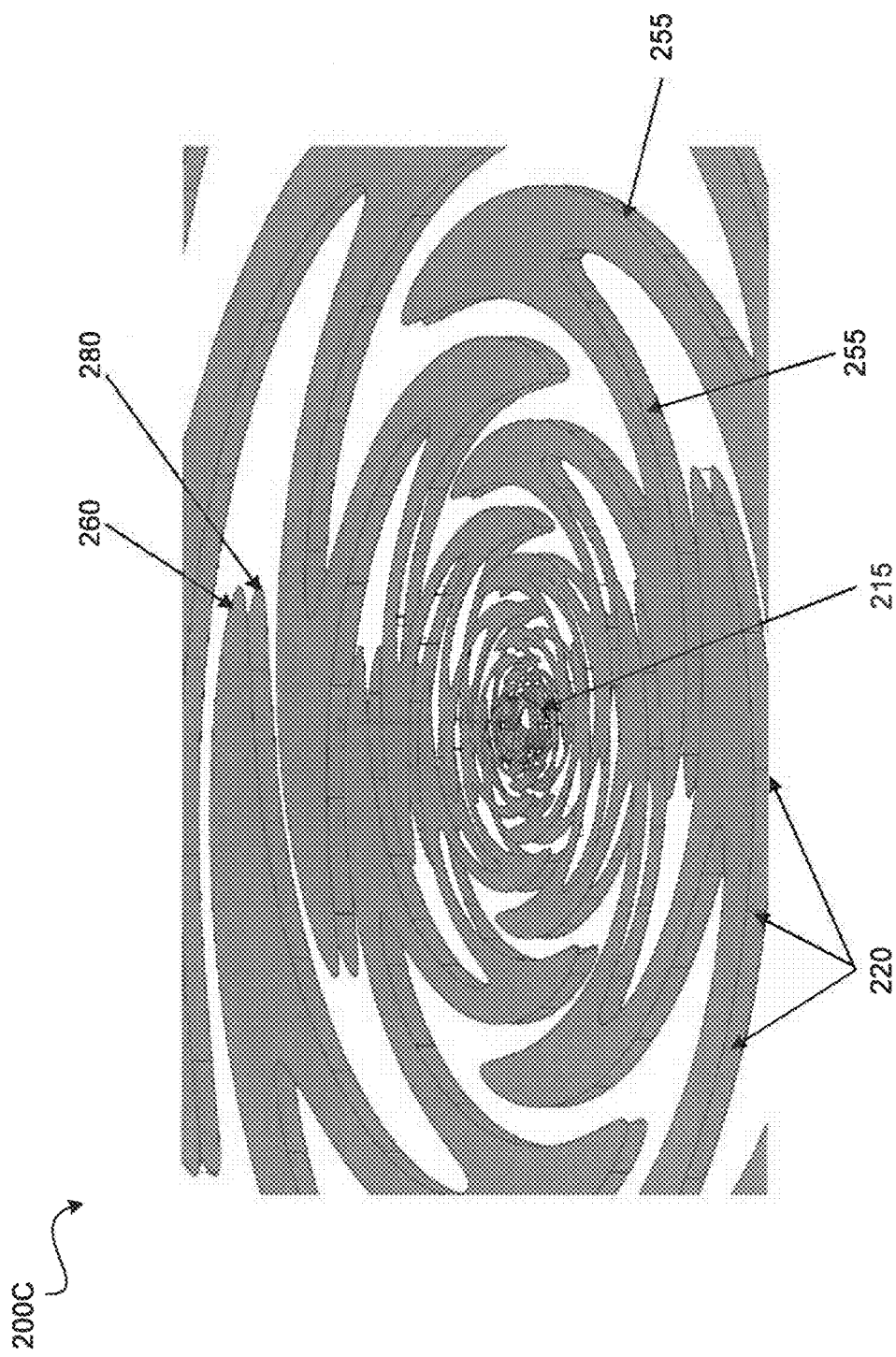

MULTI-LAYER WIDEBAND ANTENNA WITH INTEGRATED IMPEDANCE MATCHING

STATEMENT REGARDING FEDERALLY SPONSORED RESEARCH OR DEVELOPMENT

Not applicable.

FIELD OF THE INVENTION

The present invention generally relates to antenna design, and more particularly, to a multi-layer wideband antenna with integrated impedance matching.

BACKGROUND

Many radio-frequency (RF) communication antennas are planar antennas designed to be integrated with RF transmitting and receiving circuitries. A multi-layer planar antenna, which can be fabricated using the standard printed-circuit board (PCB) fabrication process, for example, may include various layers such as antenna layers (e.g., radiating layers), feed circuitry, and beam-forming portions. Planar antennas can take a variety of forms such as spiral, sinuous, and log periodic and are generally characterized by operational parameters such as gain, bandwidth, and voltage standing-wave ratio (VSWR) that are among the most important characteristics of RF antennas. The VSWR is the ratio of the amplitude of a partial standing wave at a maximum to an amplitude of the standing wave at a minimum. The antenna bandwidth can be defined as a contiguous band of frequencies in which the VSWR is below 2:1.

In order to minimize losses due to mismatch of the antenna layers to the feed circuitry, an impedance of the antenna layer has to be matched with the impedance of the feed circuitry. The matching of the antenna layer to the feed circuitry can affect the bandwidth, the VSWR, and the gain of the planar antenna. Therefore, for a wideband planar antenna, this impedance matching can have a profound effect on the antenna characteristics.

SUMMARY

In some aspects, a method for wideband impedance matching of a radio-frequency (RF) antenna includes forming a first conductive layer on a first surface of a dielectric material, forming a second conductive layer on a second surface of the dielectric material, and enabling the wideband impedance matching by providing patterned coupling (e.g., electrically conductive coupling, such as electrical connections, hereinafter "connections") between the first conductive layer and the second conductive layer through multiple vias. Forming the first conductive layer and the second conductive layer are based on an antenna-layout pattern.

In other aspects, a radio-frequency (RF) antenna with wideband impedance matching includes a first conductive layer, a second conductive layer, and patterned connections. The first conductive layer is formed on a first surface of a dielectric material. The second conductive layer is formed on a second surface of the dielectric material. The patterned coupling between the first conductive layer and the second conductive layer is formed through multiple vias to enable the wideband impedance matching. The first conductive layer and the second conductive layer are formed based on an antenna-layout pattern. The multiple vias are formed based on a via pattern that corresponds to the antenna-layout pattern.

In yet other aspects, a radio frequency (RF) antenna with wideband impedance matching includes an antenna layer, a feed circuitry, and patterned connection. The antenna layer includes multiple conductive layers isolated from one another via a corresponding number of dielectric layers. The feed circuitry is coupled to the antenna layer. The patterned connections between multiple conductive layers are formed through multiple vias to enable the wideband impedance matching between the antenna layer and the feed circuitry. The conductive layers are formed based on an antenna-layout pattern. The vias are plated hole vias formed based on a via pattern that corresponds to the antenna-layout pattern.

The foregoing has outlined rather broadly the features of the present disclosure in order that the detailed description that follows can be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing specific aspects of the disclosure, wherein:

FIG. 2C illustrates a perspective view of an example of a multi-layer RF antenna with wideband impedance matching, according to certain aspects.

DETAILED DESCRIPTION

The present disclosure is directed, in part, to methods and configuration for providing a multi-layer wideband antenna with integrated impedance matching. The subject technology allows for wideband impedance matching for antennas such as sinuous, spiral, and log-periodic antennas. The disclosed subject matter provides a significant improvement in voltage standing-wave ratio (VSWR) and antenna gain while reducing mismatch losses between the antenna and the feed circuitry. In addition, the subject technology can simplify the antenna fabrication by reducing the total part count of the multilayer antenna.

In order to maximize the gain of an antenna, the input impedance of the antenna must be matched to the feeding circuitry associated with the antenna. For antennas such as sinuous, spiral, and log-periodic antennas, the impedance is typically much higher than the standard circuit impedance of 50 Ohms. Conventionally, the loss associated with this mismatch is either just accepted or a feed circuit is added to the antenna design. For most implementations, the loss associated with these two approaches can be up to 3 dB. The disclosed solution can significantly improve the gain (e.g., up to 3 dB), VSWR, and bandwidth of wideband antennas over existing solutions. At the same time, the subject technology reduces the part count and complexity of these antennas, thus resulting in reduced antenna size and weight and significantly lower design, manufacture, and testing costs.

Figure 1:
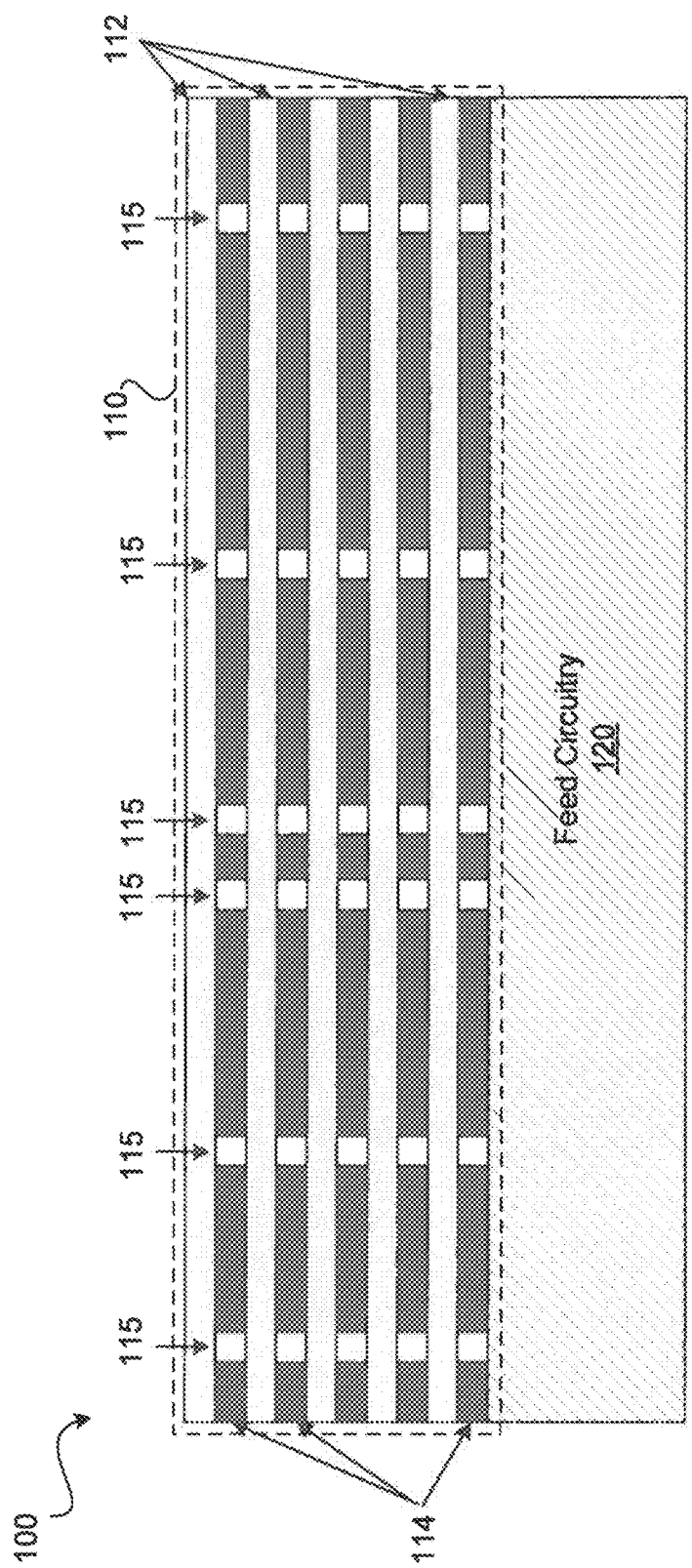
FIG. 1 illustrates a conceptual side-view diagram of an example structure of a multi-layer radio-frequency (RF) antenna with wideband impedance matching, according to certain aspects.

FIG. 1 illustrates a conceptual side-view diagram 100 of an example structure of a multi-layer radio-frequency (RF) antenna with wideband impedance matching, according to certain aspects of the subject technology. The side-view diagram 100 shows a multi-layer RF antenna (hereinafter "antenna") 110 integrated with a feed circuitry 120. The disclosed wideband matching between the antenna 110 and the feed circuitry 120 can drastically reduce the loss associated with any impedance mismatch between the antenna 110 and the feed circuitry 120. In one or more implementations, the feed circuitry 120 may be partially integrated with the antenna 110 or be an entirely separate module that is electrically connected to the antenna 110.

In some aspects, the RF antenna can be printed on a single layer of an antenna board. However, printing the antenna elements on both sides of the antenna board such that the antenna appears electrically thicker can reduce mismatch, but can be effective only over a small frequency band and suffers from poor performance outside of that frequency band. The subject technology improves the performance over a significantly wider frequency band (e.g., 54:1) and has potential for further improvement.

The antenna 110 of the subject technology may include multiple conductive layers 112 isolated from one another via a corresponding number of dielectric layers 114. The feed circuitry 120 is coupled to the antenna layer 110. Patterned connections between multiple conductive layers 112 are formed through multiple vias 115 that can enable the wideband impedance matching between the antenna layer and the feed circuitry 120. The conductive layers 112 are formed to have an antenna-layout patterns such as sinuous, spiral, log-periodic, or other patients. The vias can be plated hole vias formed based on a via pattern that can correspond to the antenna-layout pattern. In some implementations the antenna 110 is a planar antenna. The antenna 110, however, is not limited to a planar geometry, and can be implemented in conical, spherical or other geometries.

Figure 2A:
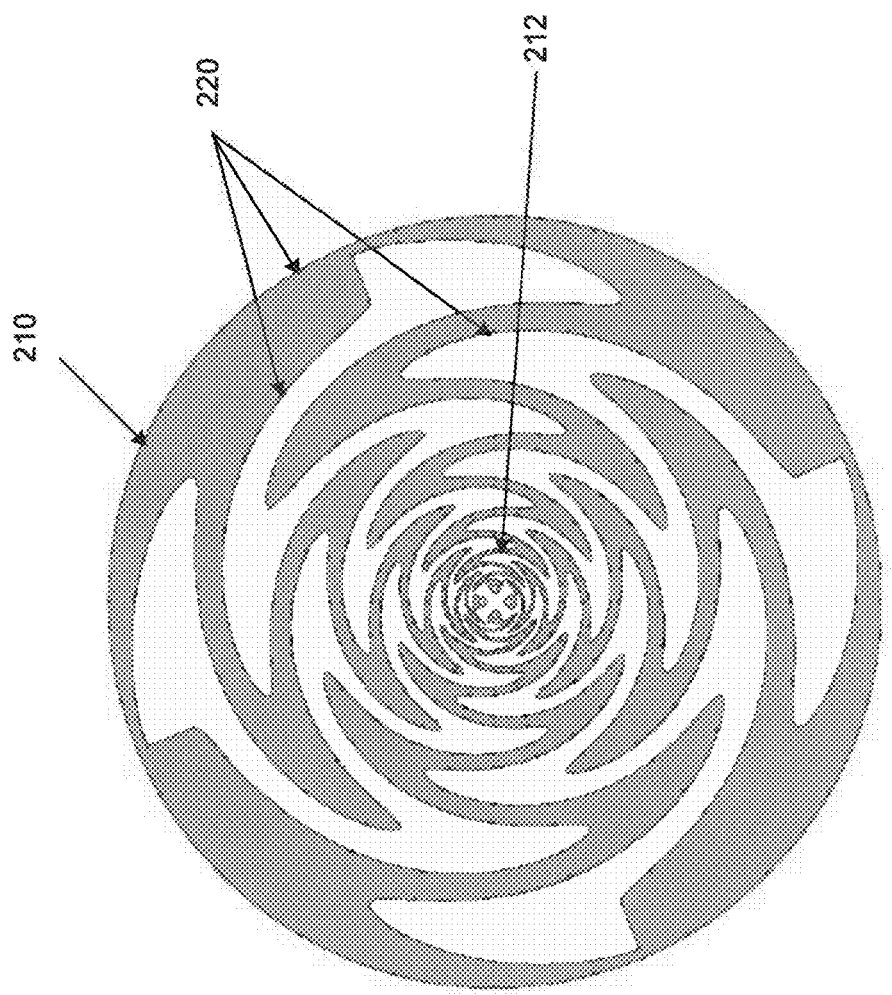
FIG. 2A illustrates a top-view diagram of an example of a multi-layer RF antenna with wideband impedance matching, according to certain aspects.

FIG. 2A illustrates a top-view diagram 200A of an example of a multi-layer RF antenna with wideband impedance matching, according to certain aspects of the subject technology. In the top-view diagram 200A, a top (e.g., a first) conducting layer 210 of a multi-layer RF antenna (hereinafter "antenna") is shown to have a sinuous pattern. In some implementations, known patterns such spiral, log-periodic, or other patterns may be used. A bottom (e.g., a second) conduction layer (not seen in the top view 200A) can have the same pattern, except for minor change near the center as described herein. The bottom layer is isolated from the top layer by a dielectric material. The patterned top and bottom conductive layers can have multiple elements, and size of the elements (such as 212) can get smaller as the middle of the antenna is approached. This is because the middle elements can operate at higher frequency (corresponding to lower wavelength) RF signals. The wideband impedance matching of the antenna is enabled by patterned connections between the top conductive layer and the bottom conductive layer through multiple vias 220. The vias 220 are formed based on a via pattern that corresponds to the antenna-layout pattern. In other words, the vias 220, the number of which can reach thousands, can follow the same pattern as the antenna-layout pattern. In some aspects, as shown in FIG. 2A, the vias 220 are formed at the edges of the elements of the antenna-layout pattern. In one or more implementations, the top and bottom conductive layers and the dielectric layer can be the same materials used in a printed-circuit board (PCB) fabrications. For example, the top and bottom conductive layers can be formed by using a metal such as copper, aluminum, tungsten, silver or gold. In some implementations the multi-layer RF antenna is a planar antenna. Implementation of the multi-layer RF antenna, however, is not limited to planar geometry and the multi-layer RF antenna can be implemented in conical, spherical or other geometries.

Figure 2B:
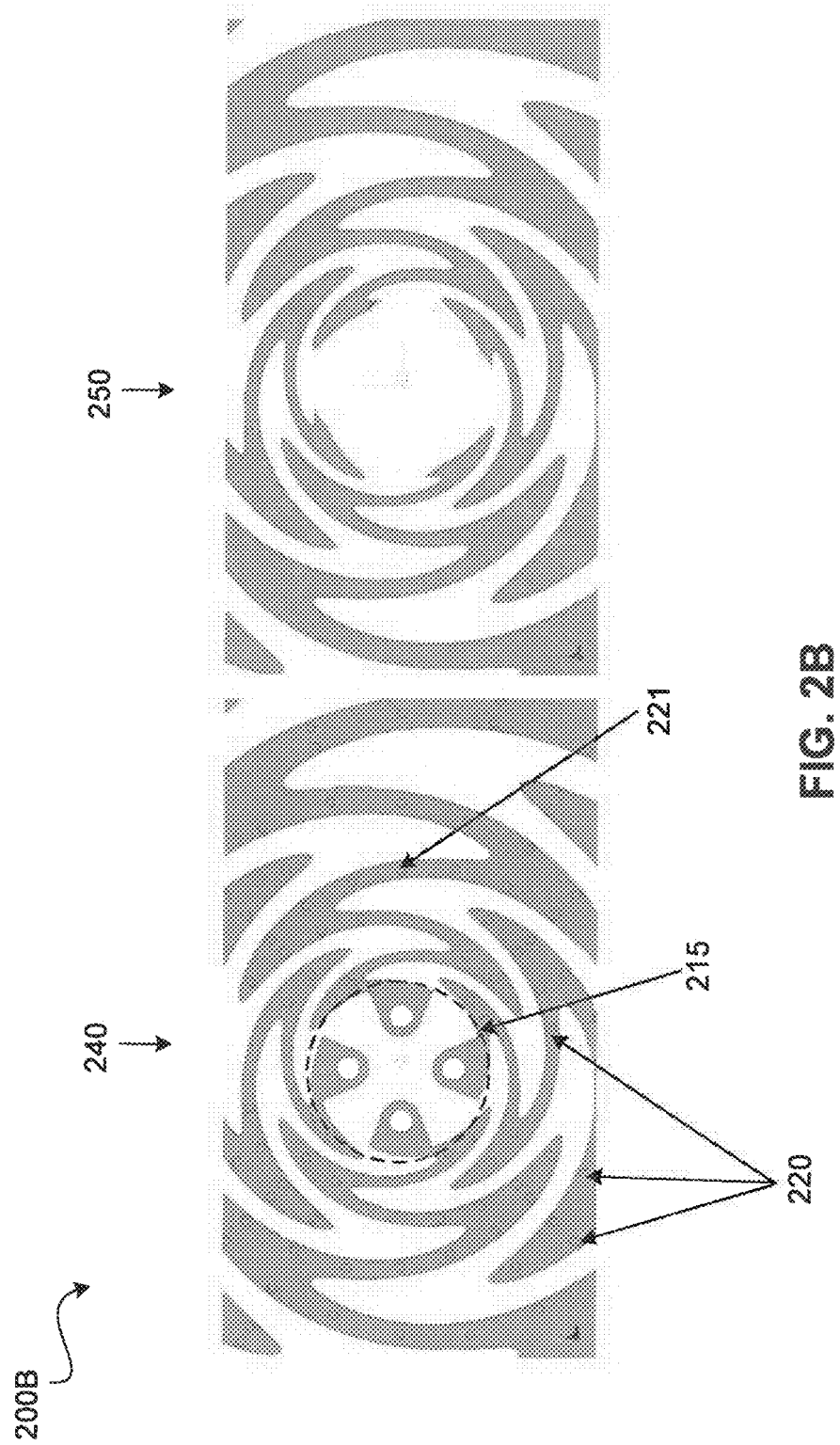
FIG. 2B illustrates a top-view and a bottom-view diagram of an example of a multi-layer RF antenna with wideband impedance matching, according to certain aspects.

FIG. 2B illustrates a top-view diagram 240 and a bottom-view diagram 250 of an example of a multi-layer RF antenna with wideband impedance matching, according to certain aspects of the subject technology. The top-view diagram 240 shows that the top (e.g., the first) conductive layer includes solder pads 215, whereas the bottom (e.g., the second) conductive layer shown in the bottom-view diagram 250 lacks any solder pads. The solder pads 215 can be used for connecting (e.g., a coaxial cable) to the antenna for carrying signals generated by the antenna or to be fed to the antenna. The solder pads can be in several different configurations including on the top layer, bottom layer or middle layers.

The vias 220 are shown to be formed on the edge of the elements of the antenna-layout pattern. Some vias (e.g., 221) that are formed on smaller elements of the antenna layout pattern are formed in middle portions of the smaller elements. In some implementations, the vias 220 are plated through-hole vias with a hole diameter within a 100-300 micrometer (μm) range. The distance between two adjacent vias is less than one-tenth of a wavelength corresponding to an operating frequency of a local element of the antenna layout pattern. Therefore, since the inner elements of the antenna-layout pattern are smaller, the distance between two adjacent vias can be smaller for inner elements of the antenna layout pattern that are closer to the center of the RF antenna. In some aspects, the diameter of the antenna depends on the operating frequency, and for an operating frequency of less than 8 GHz, can be approximately 6 cm. The placement of the vias can vary and does not have to remain constant. In some aspects, the placement of the vias may depend on the application and size restrictions.

FIG. 2C illustrates a perspective view 200C of an example of a multi-layer RF antenna with wideband impedance matching, according to certain aspects of the subject technology. The perspective view 200C shows to top conductive layer 260 and the bottom conductive layer 280 separated from each other by a dielectric layer. The vias 220 are seen at various locations indicated by vertical lines. The actual vias as seen in FIG. 2B are close to but at a short distance from the walls (e.g., sidings) 255 of the antenna pattern. The solder pads 215 are formed on the top conductive layer 260 (e.g., for coaxial feed implementation). In some aspects, depending on the application, the solder pads 215 can be formed on other conductive layers (e.g., the bottom conductive layer). In some implementations, the conductive coupling between the top and bottom conductive layers can be achieved with any type of electrical connections. For example, the vias 220 can be replaced with solid-wall portions formed on the side edges of the dielectric layer, which can conductively couple the top conductive layer 260 to the bottom conductive layer 280. In other words, the side wall 255 of the dielectric layer can be entirely or partially covered with a conductive layer that can replace the vias 220 or coexist with at least some of the vias 220 to enable better matching of the antenna to the feed circuitry.

Figure 2D:
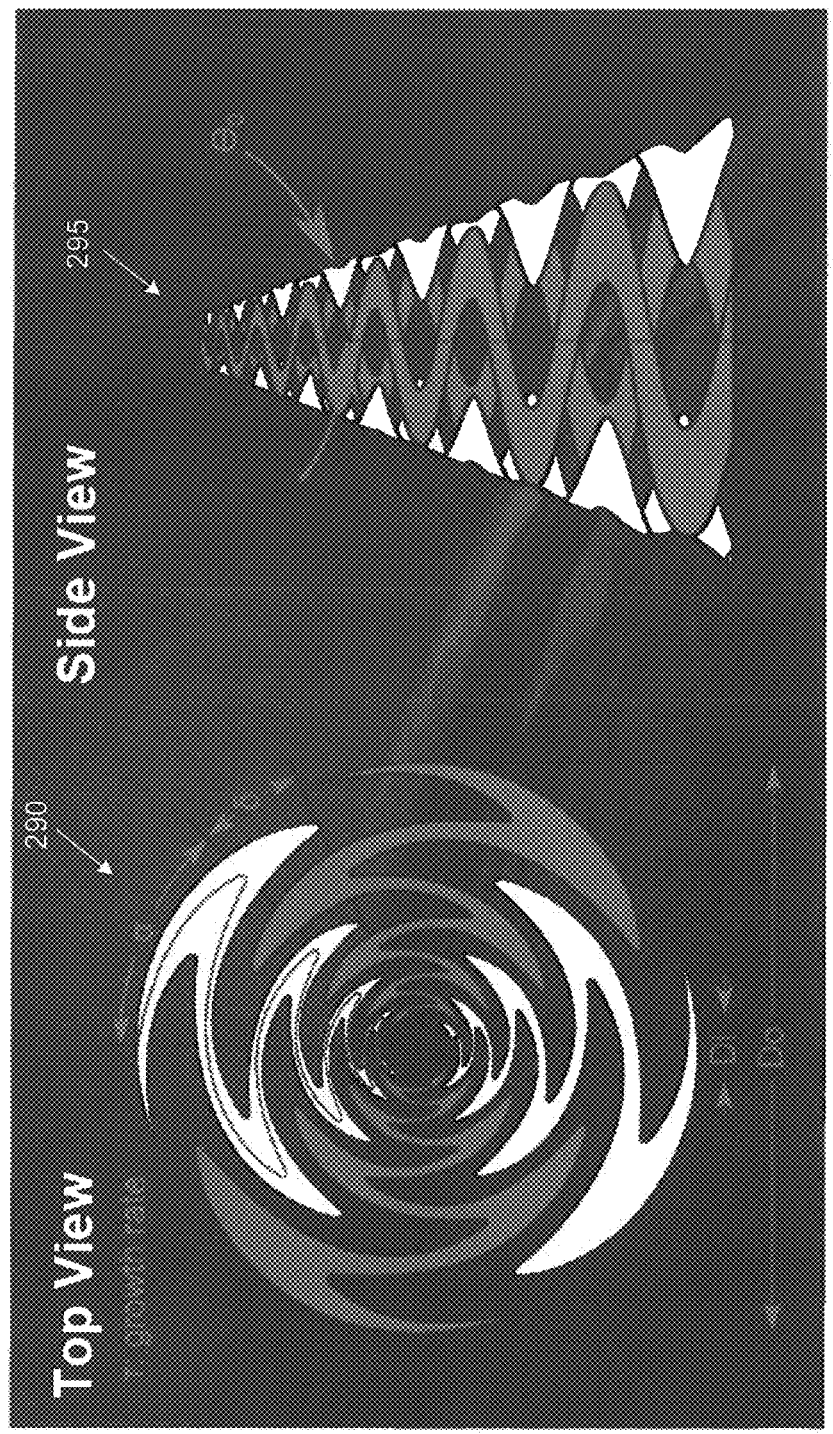
FIG. 2D illustrates top and side views of an example of a non-planar multi-layer RF antenna with wideband impedance matching, according to certain aspects.

FIG. 2D illustrates top and side views 200 and 295 of an example of a non-planar multi-layer RF antenna with wideband impedance matching, according to certain aspects of the subject technology. The non-planar multi-layer RF antenna shown in FIG. 2D depicts an example conical sinuous antenna. In the top view 290, parameters T, $\alpha$, $\delta$, Di, and Do of the conical sinuous antenna are shown, where T, $\alpha$, and $\delta$, are respectively the growth rate, angular width, and rotation angle, and Di and Do represent inner and outer diameters of the antenna, respectively. In the side view 295, the half angle parameter ($\theta_0$) of the conical sinuous antenna is shown. The subject technology in not limited to any specific value for any of these parameters, and various values may be applied depending on the design specifications.

Figure 3:
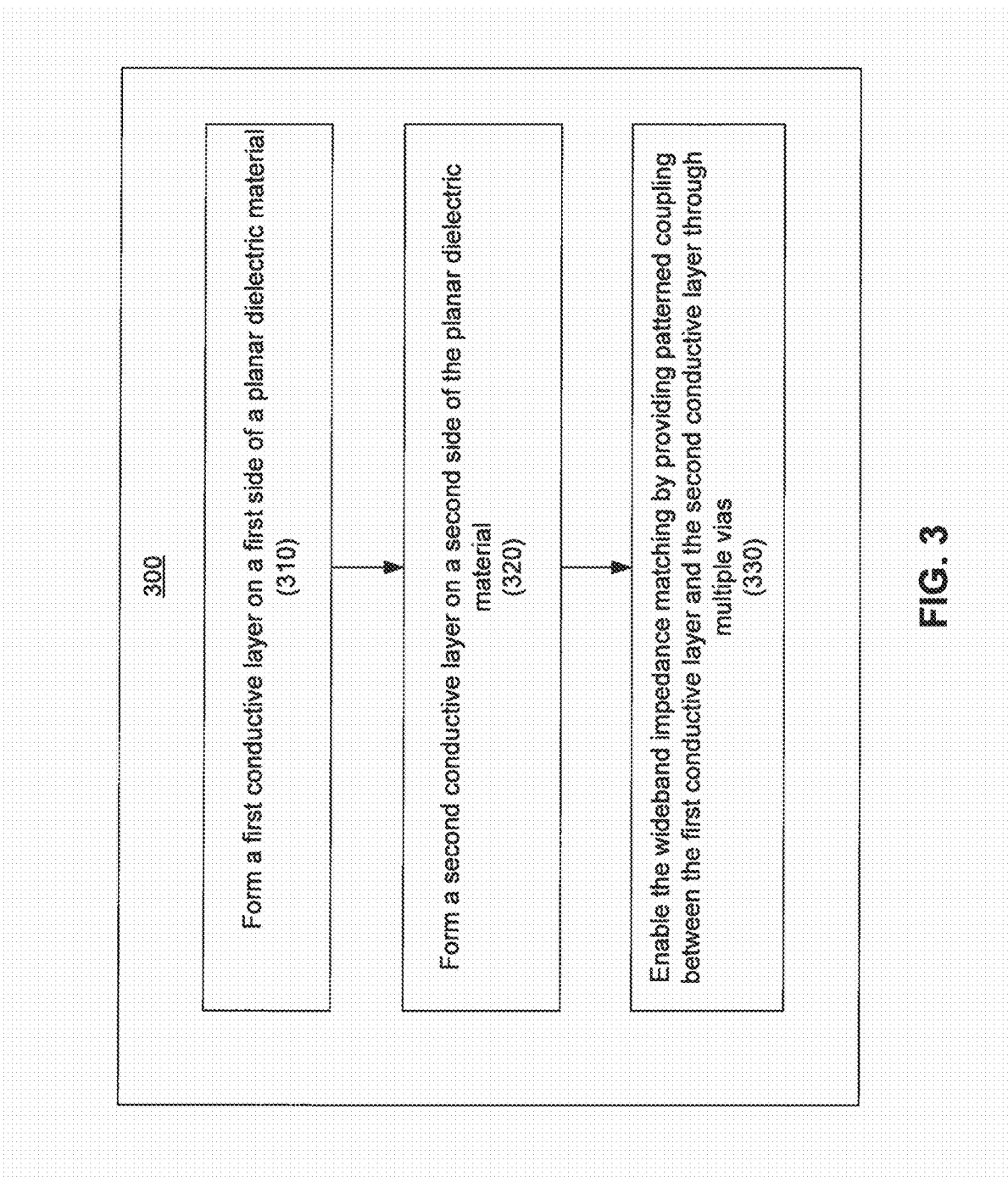
FIG. 3 illustrates a flow diagram of an example of a method for wideband impedance matching of a multi-layer RF antenna.

FIG. 3 illustrates a flow diagram of an example of a method 300 for wideband impedance matching of a multi-layer RF antenna of the subject technology. The steps of the method 300 do not need to be performed in the order shown and one or more steps may be omitted. The method 300 includes forming a first conductive layer (e.g., 210 of FIG. 2A or 260 of FIG. 2C) on a first surface of a dielectric material (e.g., 114 of FIG. 1) (310). A second conductive layer (e.g., 280 of FIG. 2C) is formed on a second surface of the dielectric material (320). The wideband impedance matching is enabled by providing patterned connections between the first conductive layer and the second conductive layer through multiple vias (e.g., 115 of FIG. 1, and 220 of FIGS. 2A-2C) (330). The first conductive layer and the second conductive layer are formed based on an antenna-layout pattern (e.g., as shown in 200A of FIG. 2A). It is understood that multi-layer RF antenna of the subject technology is not limited to the first and the second conductive layers and can include more than two conductive layers. For example, the multi-layer RF antenna can be implemented by using three or more conductive layers and two or more dielectric material layers. In some implementations the multi-layer RF antenna is a planar antenna. Implementation of the multi-layer RF antenna, however, is not limited to a planar geometry, and the multi-layer RF antenna can be implemented in conical, spherical or other geometries.

Figure 4A:
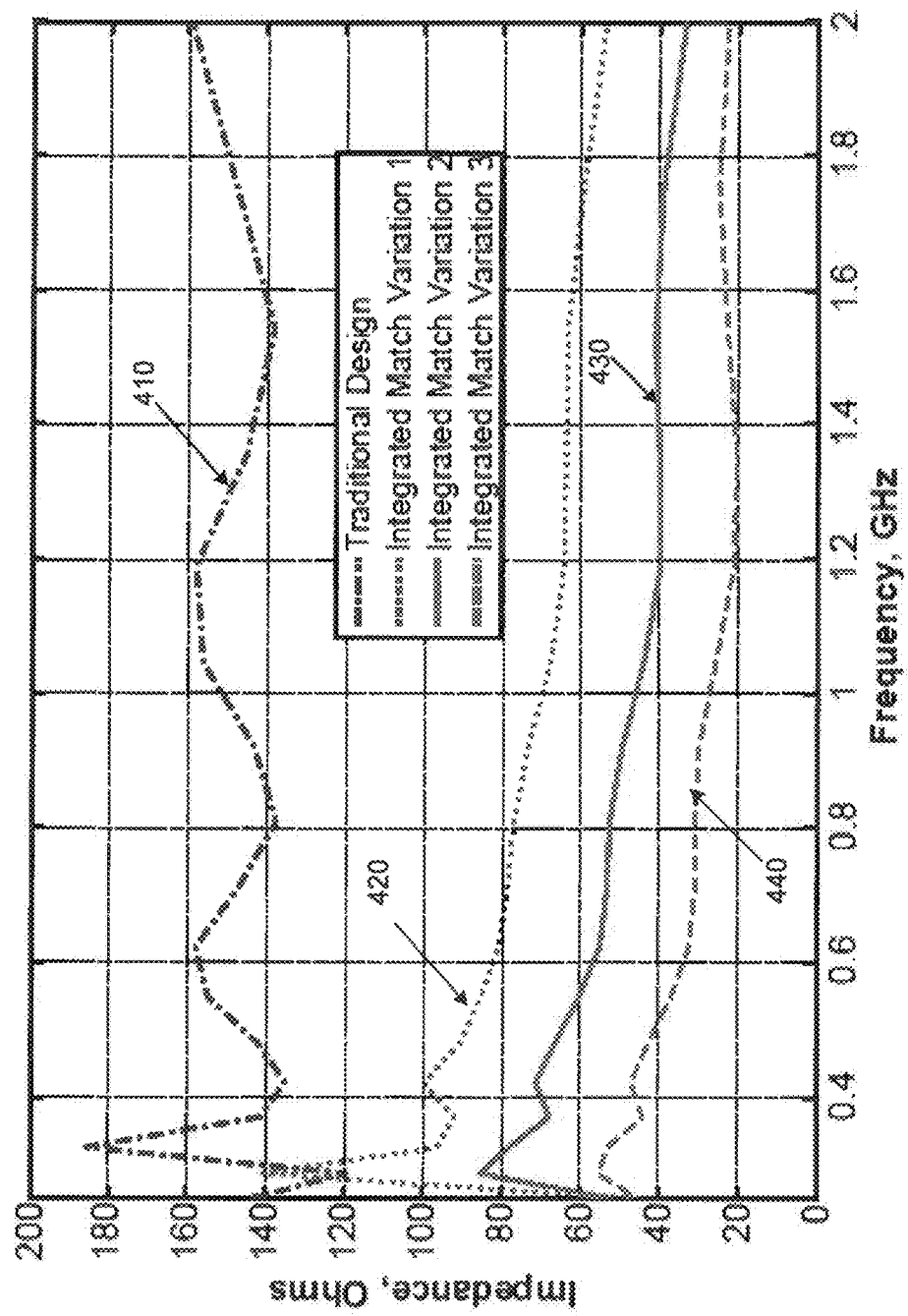
FIG. 4A illustrates a diagram of an example of a simulation result showing impedances corresponding to integrated wideband impedance matching of a multi-Layer RF antenna.

FIG. 4A illustrates a diagram of example simulation results showing impedances corresponding to integrated wideband impedance matching of a multi-layer RF antenna of the subject technology. The diagram shows plots 410, 420, 430, and 440 of input impedance versus frequency for a number scenarios of wideband impedance matching of a sinuous antenna (e.g., 200A of FIG. 2A) with a diameter of approximately 480 mm. The plot 410, which shows the highest input impedance, corresponds to a traditional design. Plots 420, 430 and 440, correspond to various thicknesses (e.g., approximately 380, 760, and 1143 µm) of the conductive layers. The simulation corresponds to the embodiment, in which the entire walls of the dielectric layer is covered with a conductive material that can conductively couple the top first and second conductive layers (e.g., instead of the vias or plated through holes). The simulation results show that input impedance can be tailored for various applications with different operating frequencies and matching impedance values.

Figure 4B:
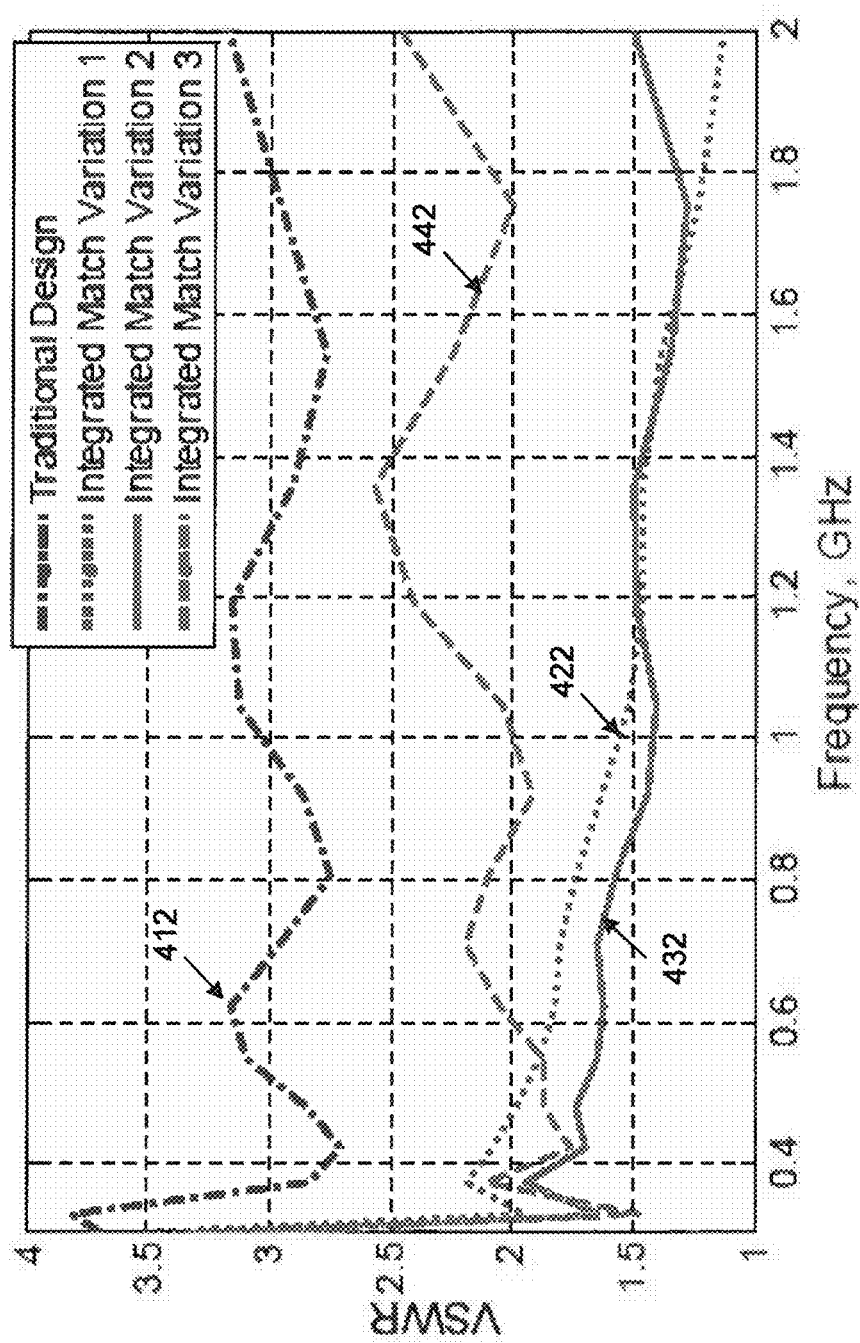
FIG. 4B illustrates a diagram of an example of a simulation result showing voltage standing-wave ratios (VSWRs) corresponding to integrated wideband impedance matching of a multi-layer RF antenna.

FIG. 4B illustrates a diagram of an example of a simulation result showing voltage standing-wave ratios (VSWRs) corresponding to integrated wideband impedance matching of a multi-layer RF antenna. The diagram shows plots 412, 422, 432, and 442 of VSWR versus frequency for a number scenarios of wideband impedance matching of a sinuous antenna (e.g., 200A of FIG. 2A) with a diameter of approximately 480 mm. The plot 412, which shows the highest VSWR, corresponds to a traditional design. Plots 422, 432 and 442, correspond to various thicknesses (e.g., approximately 380, 760, and 1143 µm) of the conductive layers. The simulation corresponds to the embodiment, in which the entire side walls of the dielectric layer is covered with a conductive material that can conductively couple the top first and second conductive layers (e.g., instead of the vias or plated through holes). The simulation results show that VSWR can also be tailored for various applications with different operating frequencies and matching impedance values.

In some aspects, the subject technology is related to a wide-band antenna design for wide-scan, low-profile phased arrays. The antenna design of the subject disclosure includes a number of advantageous features, including improved bandwidth, improved scan range corresponding to small unit cells, dual orthogonal polarization, better port isolation, higher gain, and less stringent manufacturing tolerances than the existing solutions. The subject technology may be utilized by a number of markets including, but not limited to, data transmission and communications, advanced sensors, and radar and active phased arrays.

The description of the subject technology is provided to enable any person skilled in the art to practice the various aspects described herein. While the subject technology has been particularly described with reference to the various figures and aspects, it should be understood that these are for illustration purposes only und should not be taken as limiting the scope of the subject technology.

A reference to an element in the singular is not intended to mean "one and only one" unless specifically stated, but rather "one or more". The term "some" refers to one or more. Underlined and/or italicized headings and subheadings are used for convenience only, do not limit the subject technology, and are not referred to in connection with the interpretation of the description of the subject technology. All structural and functional equivalents to the elements of the various aspects described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

Although the invention has been described with reference to the disclosed aspects, one having ordinary skill in the art will readily appreciate that these aspects are only illustrative of the invention. It should be understood that various modifications can be made without departing from the spirit of the invention. The particular aspects disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative aspects disclosed above may be altered, combined, or modified and all such variations are considered within the scope and spirit of the present invention. While compositions and methods are described in terms of "comprising," "containing," or "including" various components or steps, the compositions and methods can also "consist essentially of" or "consist of" the various components and operations. All numbers and ranges disclosed above can vary by some amount. Whenever a numerical range with a lower limit and an upper limit is disclosed, any number and any subrange falling within the broader range are specifically disclosed. Also, the terms in the claims have their plain, ordinary meaning unless otherwise explicitly and clearly defined by the patentee. If there is any conflict in the usages of a word or term in this specification and one or more patent or other documents that may be incorporated herein by reference, the definitions that are consistent with this specification should be adopted.

What is claimed is:

1. A method for wideband impedance matching of a radio-frequency (RF) antenna, the method comprising:
   forming a first conductive layer on a first surface of a dielectric material;
   forming a second conductive layer on a second surface of the dielectric material; and
   enabling wideband impedance matching by providing patterned coupling between the first conductive layer and the second conductive layer through multiple vias,
   wherein the multiple vias are interconnected by the first conductive layer and the second conductive layer that form a flat sinuous antenna-layout pattern, and wherein the multiple vias are configured to form a sinuous pattern and to provide coupling across edges of elements of the flat sinuous antenna-layout pattern.

2. The method of claim 1, wherein the wideband impedance matching reduces losses associated with a feed circuit coupled to the RF antenna.

3. The method of claim 1, wherein the antenna layout pattern comprises one of spiral, or log-periodic patterns, and wherein the antenna layout pattern comprises elements that get smaller in size towards a middle portion of the RF antenna.

4. The method of claim 1, wherein forming the first conductive layer and the second conductive layer are performed by utilizing a printed circuit board (PCB) fabrication process.

5. The method of claim 1, further comprising forming the multiple vias by forming plated through-hole vias, wherein a diameter of the plated through-hole vias are within a 100-300 micrometer (µm) range.

6. The method of claim 1, further comprising forming vias of the multiple vias, for smaller elements, near middle portions of the smaller elements.

7. The method of claim 1, further comprising forming the multiple vias while keeping a distance between two adjacent vias of the multiple vias less than one-tenth of a wavelength corresponding to an operating frequency associated with a corresponding local element of the antenna layout pattern.

8. The method of claim 7, further comprising forming the multiple vias while keeping the distance between two adjacent vias of the multiple vias smaller for smaller elements of the antenna layout pattern that are closer a middle of the RF antenna.

9. The method of claim 1, further comprising forming the multiple vias by wall couplings formed by covering portions or entire walls of the dielectric layer with a conductive material can conductively couple the top first and second conductive layers, and wherein the dielectric layer comprises a planar dielectric layer.

10. The method of claim 1, wherein forming the first and the second conductive layers comprises forming the first and the second conductive layers using a metal including copper, aluminum, tungsten, silver, or gold, and wherein the method further comprises forming the first conductive layer by including coupling structures for coupling to one or more coupling media, and wherein the coupling structures includes solder pads formed in a middle of the antenna for coupling to a coaxial cable.

11. A radio-frequency (RF) antenna with wideband impedance matching, the RF antenna comprising:
   a first conductive layer formed on a first surface of a dielectric material;
   a second conductive layer formed on a second surface of the dielectric material; and
   a patterned coupling between the first conductive layer and the second conductive layer through, multiple vias to enable wideband impedance matching,
   wherein the multiple vias are interconnected by the first conductive layer and the second conductive layer that form a flat sinuous antenna-layout pattern, and wherein the multiple vias are configured to form a sinuous pattern and to provide coupling across edges of elements of the flat sinuous antenna-layout pattern.

12. The RF antenna of claim 11, wherein the antenna layout pattern comprises one of spiral, or log-periodic patterns, and wherein the antenna layout pattern comprises elements that get smaller in size towards a middle portion of the RF antenna.

13. The RF antenna of claim 11, wherein the first conductive layer and the second conductive layer are formed on the dielectric material by utilizing a printed circuit board (PCB) fabrication process.

14. The RF antenna of claim 11, wherein the multiple vias are plated through-hole vias, wherein a diameter of the plated through-hole vias are within a 100-300 micrometer (µm) range.

15. The RF antenna of claim 14, wherein some vias of the multiple vias that are formed on smaller elements of the antenna layout pattern are formed in middle portions of the smaller elements.

16. The RF antenna of claim 14, wherein a distance between two adjacent vias of the multiple vias is less than one-tenth of a wavelength corresponding to an operating frequency associated with a corresponding local element of the antenna layout pattern.

17. The RF antenna of claim 14, wherein a distance between two adjacent vias of the multiple vias is smaller for smaller elements of the antenna layout pattern that are closer to a middle of the RF antenna.

18. The RF antenna of claim 14, wherein the multiple vias are formed by wall couplings formed by covering portions or entire walls of the dielectric layer with a conductive material that can conductively couple the top first and second conductive layers, and wherein the dielectric layer comprises a planar dielectric layer.

19. The RF antenna of claim 11, wherein the first and second conductive layers comprise a metal including copper, aluminum, tungsten, silver, or gold, and wherein the first conductive layer comprises coupling structures for coupling to one or more coupling media, and wherein the coupling structures includes solder pads formed in a middle portion of the RF antenna for coupling to a coaxial cable.

20. A radio-frequency (RF) antenna with wideband impedance matching, the RF antenna comprising:

an antenna layer comprising a plurality of conductive layers isolated from one another via a corresponding number of dielectric layers;

a feed circuitry coupled to the antenna layer; and a patterned coupling between the plurality of conductive layers formed through multiple vias to enable wideband impedance matching between the antenna layer and the feed circuitry, wherein the multiple vias are interconnected by the plurality of conductive layers that form a flat sinuous antenna-layout pattern, and wherein the multiple vias are plated hole vias configured to form a sinuous pattern to provide coupling across edges of elements of the flat sinuous antenna-layout pattern.

* * * * *